(12) United States Patent
Ogura et al.

(10) Patent No.: US 7,742,336 B2
(45) Date of Patent: Jun. 22, 2010

(54) TRAP-CHARGE NON-VOLATILE SWITCH CONNECTOR FOR PROGRAMMABLE LOGIC

(75) Inventors: Tomoko Ogura, Hillsboro, OR (US); Seiki Ogura, Hillsboro, OR (US); Nori Ogura, Hillsboro, OR (US)

(73) Assignee: Gumbo Logic, Inc., Hillsboro, OR (US)

( * ) Notice: Subject to any disclaimer, the term of this patent is extended or adjusted under 35 U.S.C. 154(b) by 142 days.

(21) Appl. No.: 11/982,172

(22) Filed: Nov. 1, 2007

(65) Prior Publication Data

US 2008/0101117 A1 May 1, 2008

Related U.S. Application Data

(60) Provisional application No. 60/856,053, filed on Nov. 1, 2006.

(51) Int. Cl.
*G11C 16/04* (2006.01)
(52) U.S. Cl. .............. 365/185.03; 365/185.05; 365/185.28
(58) Field of Classification Search ........... 365/185.03, 365/185.05, 185.08, 185.28; 977/938
See application file for complete search history.

(56) References Cited

U.S. PATENT DOCUMENTS

| | | | |
|---|---|---|---|
| 4,750,155 A | 6/1988 | Hsieh | |
| 4,899,205 A | 2/1990 | Hamdy et al. | |
| 5,576,568 A | 11/1996 | Kowshik | |
| 5,587,603 A | 12/1996 | Kowshik | |
| 6,252,273 B1 | 6/2001 | Salter, III et al. | |
| 6,356,478 B1 | 3/2002 | McCollum | |
| 6,388,293 B1 | 5/2002 | Ogura et al. | |
| 6,788,111 B2 | 9/2004 | Sun et al. | |
| 6,970,383 B1 | 11/2005 | Han et al. | |
| 7,129,748 B1 | 10/2006 | McCollum et al. | |
| 2001/0019151 A1 | 9/2001 | Caywood | |
| 2004/0164778 A1* | 8/2004 | Toyoda et al. ............... | 327/219 |
| 2005/0012134 A1 | 1/2005 | Masuoka et al. | |
| 2005/0201189 A1 | 9/2005 | Fujiwara et al. | |
| 2005/0219900 A1 | 10/2005 | Kamigaki et al. | |
| 2006/0237784 A1* | 10/2006 | Rahim et al. ............... | 257/333 |
| 2007/0030027 A1* | 2/2007 | Madurawe ................... | 326/38 |

FOREIGN PATENT DOCUMENTS

| | | |
|---|---|---|
| EP | 1 519 489 | 3/2005 |
| WO | PCT/US2007/023050 | 2/2008 |
| WO | PCT/US2007023050 | 9/2009 |

* cited by examiner

*Primary Examiner*—Hoai V Ho
(74) *Attorney, Agent, or Firm*—Saile Ackerman LLC; Stephen B. Ackerman

(57) ABSTRACT

A nonvolatile trap charge storage cell selects a logic interconnect transistor uses in programmable logic applications, such as FPGA. The nonvolatile trap charge element is an insulator located under a control gate and above an oxide on the surface of a semiconductor substrate. The preferred embodiment is an integrated device comprising a word gate portion sandwiched between two nonvolatile trap charge storage portions, wherein the integrated device is connected between a high bias, a low bias and an output. The output is formed by a diffusion connecting to the channel directly under the word gate portion. The program state of the two storage portions determines whether the high bias or the low bias is coupled to a logic interconnect transistor connected to the output diffusion.

4 Claims, 7 Drawing Sheets

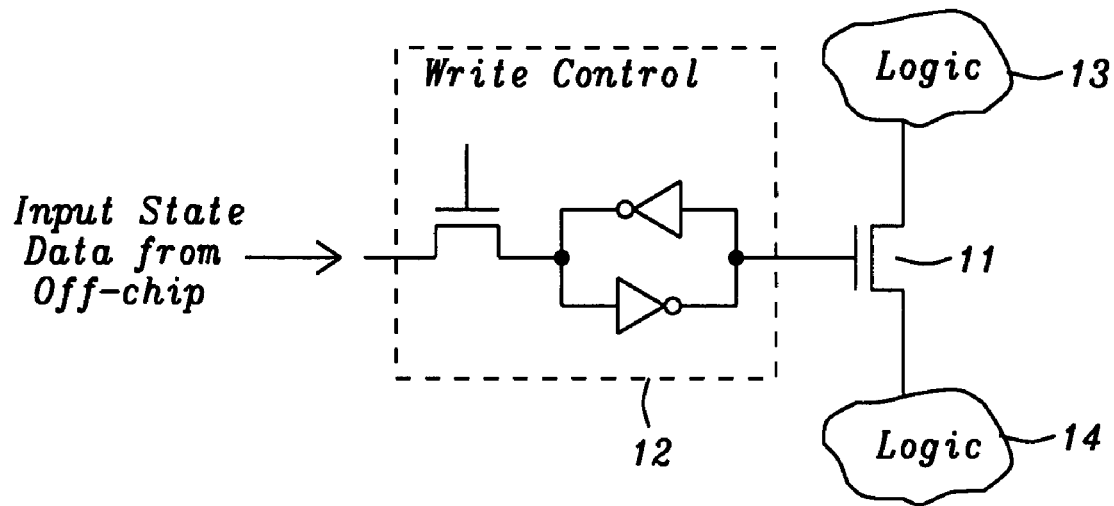
FIG. 1 - Prior Art
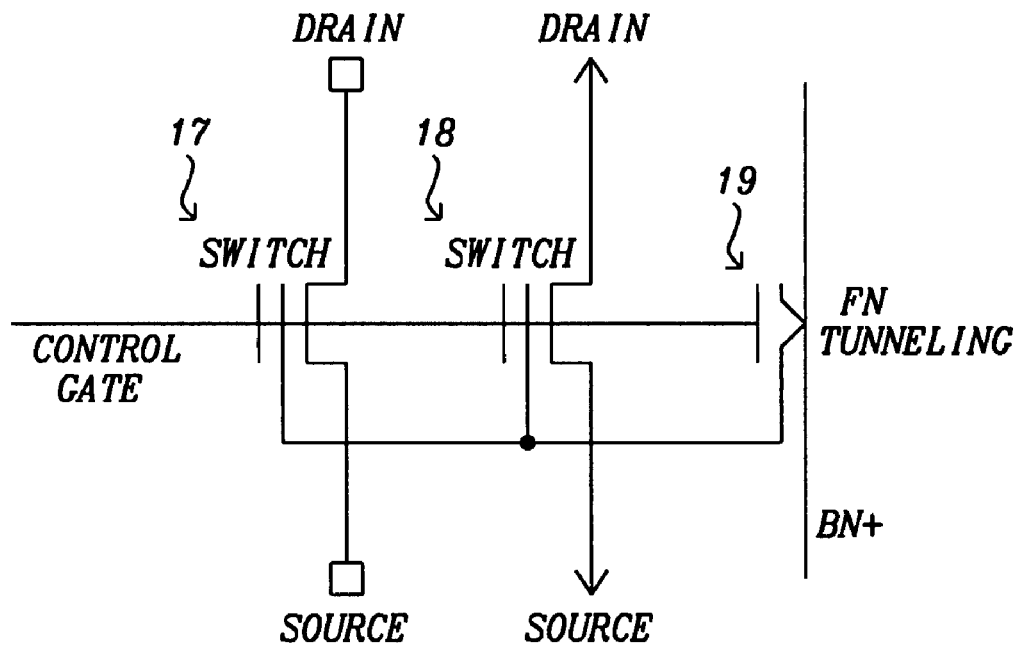
FIG. 2 - Prior Art

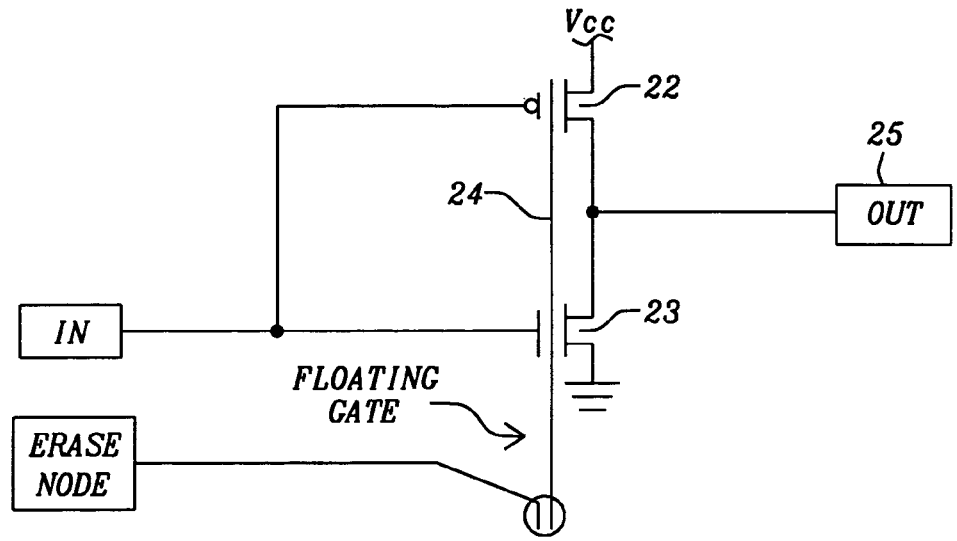
*FIG. 3 - Prior Art*
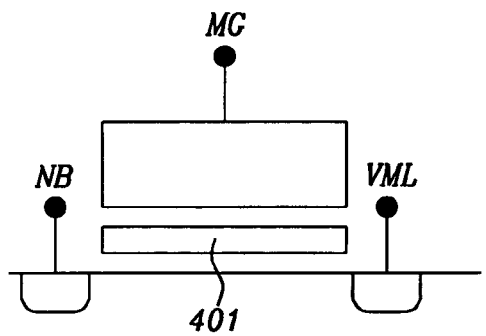
*FIG. 4a*
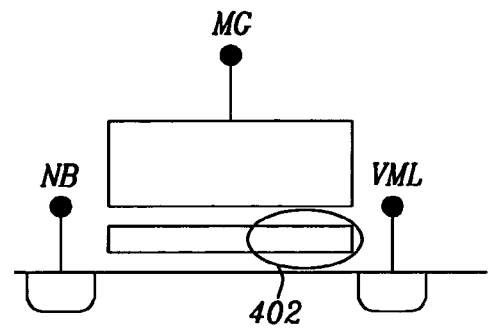
*FIG. 4b*
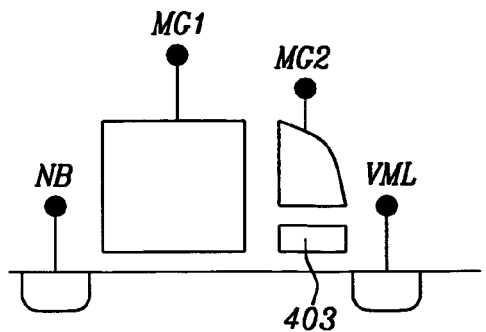
*FIG. 4c*
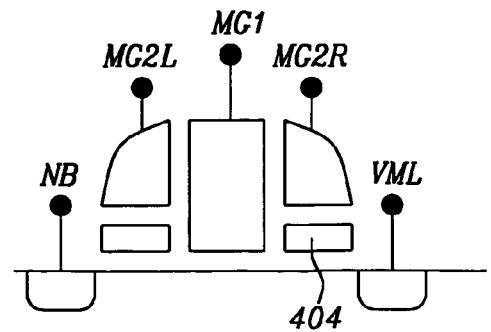
*FIG. 4d* ns. In FIG. 1, two logic areas 13 and
TRAP-CHARGE NON-VOLATILE SWITCH CONNECTOR FOR PROGRAMMABLE LOGIC This application claims priority to Provisional Patent Application Ser. No. 60/856,053, filed on Nov. 1, 2006, which is herein incorporated by reference in its entirety.

BACKGROUND OF THE INVENTION

1. Field of Invention

The present invention is related to nonvolatile memories and configurable logic elements and in particular, to a configurable logic elements, which is implemented by trapped-charge nonvolatile memory.

2. Description of Related Art

Programmable logic arrays such as program logic arrays (PLA) and field programmable gate arrays (FPGA) comprise configurable logic elements and configurable interconnection paths. Different functions may be implemented upon the same hardware chip by programming the configuration elements, which are conventionally static random access memory (SRAM) or latches connected to pass gates. FIG. 1 shows a programmable logical connection of prior art, in which the pass transistor 11 is connected between two logic areas 13 and 14. The gate of the pass transistor 11 is connected to a latch 12. The setting of the latch 12 controls whether or not the pass transistor 11 will be turned on or off. Generally, a latch and/or an SRAM is used to control the state of the pass transistor because the process technology can be simple CMOS. U.S. Pat. No. 4,750,155 (Hsieh) is directed to a five-transistor memory cell which includes two inverters and a pass transistor that can be reliably read and written. However, the disadvantages of using latches and SRAM is that the programmable elements are volatile, which means that the state of the latch and the SRAM must be re-established each time power is turned on.

Non-volatile memory can also be incorporated into the programming configuration elements in the form of fuses or anti-fuses, as well as erasable programmable read-only memory (EPROM) and electrically erasable programmable read-only memory (EEPROM) cells. Fuse-based non-volatile memory (NVM) involves separating segments of wiring paths with a high concentrated current; and are therefore, not re-programmable. U.S. Pat. No. 4,899,205 (Handy, et al.) is directed to an electrically-programmable low-impedance anti-fuse element. However, EPROM and EEPROM devices can be repeatedly programmed, but require high voltages for program and erase. Thicker oxide devices as well as more complex processes are required, which can degrade the chip performance and increase the processing cost.

In general, in an FPGA there are several types and variations of logical connections. In FIG. 1, two logic areas 13 and 14 are connected together via a NMOS pass gate 11. Using a single gate provide the best utilization of semiconductor area, but the transmitted signal between the two logic areas is degraded by the VT (threshold voltage) of the transistor 11. In order to avoid the VT drop, it is also possible to form the connection using a NMOS-PMOS complementary pass-gate, or with a thicker-oxide NMOS transistor and a boosted gate voltage. An FPGA implemented with reprogrammable non-volatile memory incorporated within a logical connection has been implemented by a floating gate type of memory. In U.S. Pat. No. 5,576,568 (Kowshik) a single-transistor electrically alterable switch is directed to a floating gate memory, which is programmed and erased by Fowler-Nordheim tunneling.

In U.S. Pat. No. 6,252,273 B1 (Salter III et al.) a nonvolatile reprogrammable interconnect cell with FN tunneling device for programming and erase is directed to a device configuration in which two floating gate devices share a single floating gate; one device functions as the memory storage device and the other device functions as the logic switch cell. Shown in the prior art of FIG. 2, the source and drain of the logic switch cell 17 is connected to a logical array, whereas the source and drain of the memory storage 18 can be biased to program and erase electrons to and from the common floating gate. Programming and erasing the switch transistor 17 is effected entirely by the tunneling in the electron tunneling device 19. The two main advantages of this device is smaller area than a typical SRAM device, and non-volatility. Thus, the logic array containing the device of FIG. 2 is already configured upon boot-up; however, having a floating gate device in the path of logic could have a negative impact on speed, because a thicker oxide device is slower. One way to reduce the speed disadvantage is to lower the threshold voltage of the floating gate logic switch 17 until it becomes a negative value, thus increasing the current drive of the device.

U.S. Pat. No. 5,587,603 (Kowshik) is directed towards a zero power non-volatile latch consisting of a PMOS floating gate transistor and an NMOS floating gate transistor, with both devices sharing the same floating gate and control gates. Shown in FIG. 3, the drains of the devices are also connected together to form the output terminal, which is generally applied to the gate of the logic switch gate. Storage of electrons in the common floating gate will determine whether the logic switch gate is on or off.

U.S. Pat. No. 5,587,603 (Kowshik) a two-transistor zero-power electrically-alterable non-volatile latch is directed to a latch consisting of a PMOS floating gate transistor 22 and an NMOS floating gate transistor 23 where both devices share the same floating gate 24 and control gates as shown in FIG. 3. The drains of the transistors are also connected together to form the output terminal 25, which is generally applied to the gate of the logic switch gate. Storage of electrons in the common floating gate determines whether the logic switch gate is on or off.

The preceding and other prior art, such as NVM in programmable logic, have been implemented with floating gate types of flash memory. However there has been a recent trend to use charge trap mediums instead of floating gate to store charge. In embedded CMOS applications like NVM programmable logic, trap-charge memories provide better reliability, good scalability, simple processing and in some cases, lower voltage operation.

Four basic types of trap-based memory cells are shown in FIGS. 4a, 4b, 4c and 4d. FIG. 4a shows a basic planar structure in which nitride or some other trap material 401 is placed under the control gate MGATE. Here charge is stored uniformly throughout the trap film 401. Electrons are injected and ejected by tunneling through the channel. Voltage conditions for program and erase are given in TABLE 1a. If the tunneling mechanism utilized is direct tunneling, the bottom oxide thickness should be thin, on the order of approximately twenty Angstroms. If the tunneling mechanism used is Fowler-Nordheim, then the bottom oxide thickness can be thicker than approximately 40 Angstroms, but higher voltages may be needed. Several types of band gap engineered oxides are currently being investigated in the industry, which may reduce the voltage requirement during Fowler-Nordheim tunneling.

SUMMARY OF THE INVENTION

It is an objective of the present invention to introduce a non-volatile configuration element for programmable logic arrays, using trap-based memory devices, rather than a floating gate memory devices.

It is further an objective of the present invention to provide a single integrated device comprising a word gate portion surrounded by two trap charge storage portions on a single channel, wherein the output of the single integrated device is the channel directly under the word gate portion.

It is still further an objective of the present invention to provide a trap charge insulator between a semiconductor oxide and a control gate, wherein the trap charge insulator is a nitride film, a nano crystal film or any other insulator film material that can suitably provide nonvolatile charge storage.

Four basic types of trap-charge storage cells are shown in FIGS. 4a, 4b, 4c and 4d. FIG. 4a shows a basic planar structure in which a nitride 401, or equivalent material, is placed under the control gate MG. Here charge is stored uniformly throughout the trap film 401. Electrons are injected and ejected by tunneling through the channel. Voltage conditions for program and erase are given in TABLE 1a. If the tunneling mechanism utilized is direct tunneling, the bottom oxide thickness should be thin, on the order of approximately twenty Angstroms. If the tunneling mechanism used is Fowler-Nordheim, then the bottom oxide thickness can be thicker than approximately 40 Angstroms, but higher voltages may be needed. Several types of band gap engineered oxides are currently being investigated in the industry, which may reduce the voltage requirement during Fowler-Nordheim tunneling.

TABLE 1A

| Operation | Mechanism | NB | VML | MG |
|---|---|---|---|---|
| Read | Channel read | 1.5 | 0 | 1.5 |
| Program | Direct tunneling | 0 | 0 | 15 |
| Erase | Direct tunneling | 15 | 15 | 0 |

FIG. 4b shows the same structure as FIG. 4a; however in this cell, charge is stored at the edges of the nitride film, as denoted by the dotted circle 402. It should be noted that for dual storage, it is possible to use both edges of the nitride film. The voltages for operation on the single side 401 are given in TABLE 1b.

TABLE 1B

| Operation | Mechanism | NB | VML | MG |
|---|---|---|---|---|
| Read | Reverse read | 1.5 | 0 | 1.5 |
| Program | CHE injection | 0 | 8 | 10 |
| Erase | Hot hole injection* (erase both sides) | 8 | 8 | −7 |

A single sided split gate structure with a nitride film 403 under the split gate is shown in FIG. 4c, and the corresponding voltage operation table is given in TABLE 1c.

TABLE 1C

| Operation | Mechanism | NB | VML | MG1 | MG2 |
|---|---|---|---|---|---|
| Read | Reverse read | 1.5 | 0 | 1.5 | 1.5 |
| Program | CHE injection | 0 | 5 | 1 | 5 |
| Erase | Hot hole injection | 0x | 5 | 0 to −3 | −3 |

FIG. 4d shows a twin split gate structure with nitride film 404 under both twin split gates, and the voltage operation table is given by TABLE 1d.

TABLE 1D

| Operation | Mechanism | NB | VML | MG1 | MG2R | MG2L |
|---|---|---|---|---|---|---|
| Read | Reverse read | 1.5 | 0 | 1.5 | 1.5 | 1.5-2.5 |
| Program | CHE injection | 0 | 5 | 1 | 5 | 1.5-2.5 |
| Erase | Hot hole injection | 0x | 5 | 0 to −3 | −3 | −3 |

BRIEF DESCRIPTION OF THE DRAWINGS

This invention will be described with reference to the accompanying drawings, wherein:

FIG. 1 shows a programmable logical connection of prior art;

FIG. 2 is a non-volatile programmable interconnect cell of prior art;

FIG. 3 is an electrically alterable, zero power non-volatile latch of prior art;

FIGS. 4a, 4b 4c and 4d show basic types of trap-based memory cells;

DETAILED DESCRIPTION OF THE PREFERRED EMBODIMENT

Figure 5:
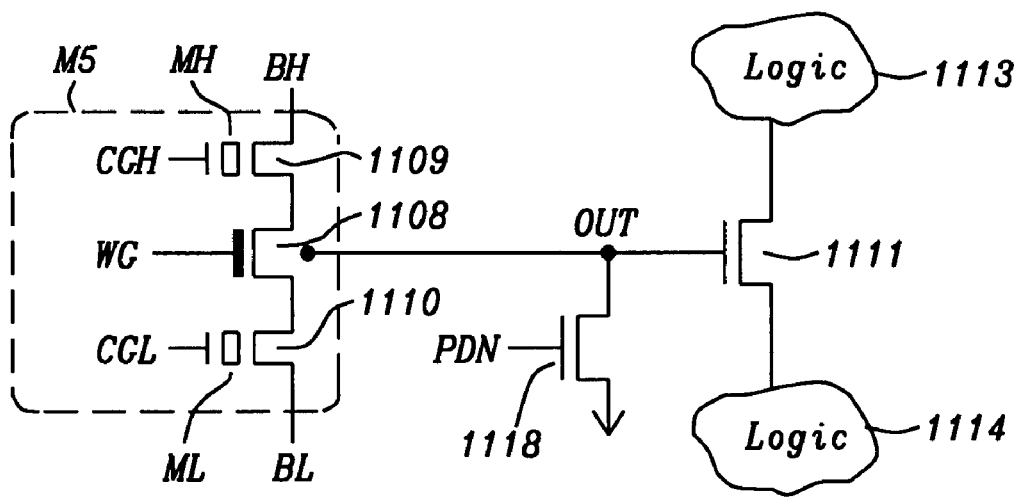
FIG. 5 is a schematic diagram the preferred embodiment of the present invention.

A circuit diagram of the preferred embodiment is shown in FIG. 5. An integrated dual storage site device M5 with an output OUT is connected to a gate of a Switch 1111, which in turn is connected between two logic elements 1113 and 1114. The switch state of the switch 1111 is controlled by the programmed state of the of the two storage sites MH and ML. The storage elements MH and ML are an insulator formed over the initial oxide of the device, for example a nitride film or a nano crystal film that traps charge.

The dual storage site device M5 is comprised of a word gate device portion 1108 that is sandwiched between a high side storage device portion 1109, which is connected to a high bias BH and a low side storage device portion 1110, which is connected to a low bias BL. A diffusion connected the channel under the word gate device portion 1108 forms an output OUT that is connected to the gate of the logic interconnect switch 1111. A CMOS transistor, controlled by a signal PDN connects the output OUT to circuit ground when the storage sites MH and ML are being programmed or erased.

A word gate signal WG is connected to the word gate device portion 1108, a control gate signal CGH is connected to the control gate of the high side storage device 1109, and a control gate signal CGL is connected to the control gate of the low side storage device portion 1110. The word gate signal WG and the two control gate signals CGH and CGL are used to program, erase the stored charge in the two storage sites MH and ML and to allow reading of the storage device M5 from which a signal is connected to logic interconnect transistor 1111 to turn the logic interconnect transistor on or off. TABLE 2 shows the various voltages necessary for program, erase and read the storage device M5. In order for the switch state to be "off" in the read mode, the storage site MH is programmed to produce a high threshold voltage for upper storage device portion 1109 and storage site ML is erased to produce a low threshold voltage for the lower storage device portion 1110, allowing a low logic voltage, 0V, to be connected to the logic interconnect transistor 1111, which turns off the logic interconnect transistor. To turn on the logic interconnect transistor 1111, the storage site ML is program creating a high threshold voltage in the lower storage device portion 1110, which blocks the low bias BL from the word gate channel portion 1108 and the storage site MH is erased, creating a low threshold voltage in the upper storage device portion 1109 to allow the high bias BH to the word gate channel portion 1108. The storage sites MH and ML are programmed by channel hot electron injection and erased by hot hole erase.

TABLE 2

| Mode | WG | CGH | CGL | BH | BL | PDN | OUT | Switch State |
|---|---|---|---|---|---|---|---|---|
| Read | 2.5 | 1.5 | 1.5 | 1.5 | 0 | 0 | 0 | OFF |
| Read | 2.5 | 1.5 | 1.5 | 1.5 | 0 | 0 | 1.5 | ON |
| Program MH Erase ML | 1.0 | +5.0 | −3.0 | 5 | 5 | 1.5 | 0 | OFF |
| Erase MH Program ML | 1.0 | −3.0 | +5.0 | 5 | 5 | 1.5 | 0 | OFF |
| Program both MH & ML | 1.0 | +5.0 | +5.0 | 5 | 5 | 1.5 | 0 | OFF |
| Erase both MH & ML | 1.0 | −3.0 | −3.0 | 5 | 5 | 1.5 | 0 | OFF |

Figure 6:
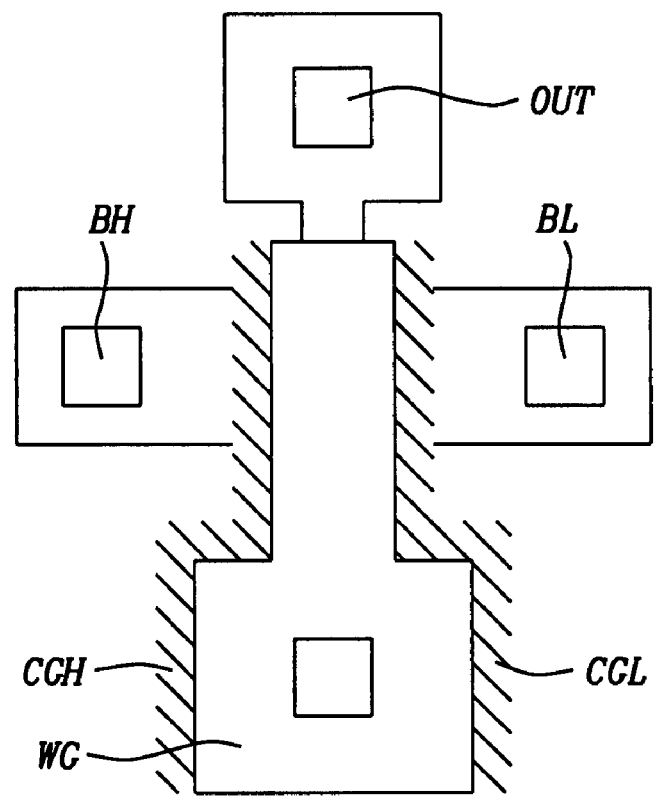
FIG. 6 is a cell layout of the preferred embodiment of the present invention.

In FIG. 6 is shown a semiconductor layout for the memory device M5 of the preferred embodiment. The channel under the three device portions 1108, 1109 and 1110 (FIG. 5) is shown connected to the three diffusions for BH, BL and OUT. Overlaying the channel are the two control gates CGH and CGL and the word gate WG. Under the control gates CGH and CGL are located the stored charge insulator films MH and ML, respectively. The channel of the storage device M5 is a center-tapped channel where OUT is the center tap connected to the portion under the word gate WG and connects the voltage of the channel under the word gate to the logic interconnect device 1111.

Figure 7:
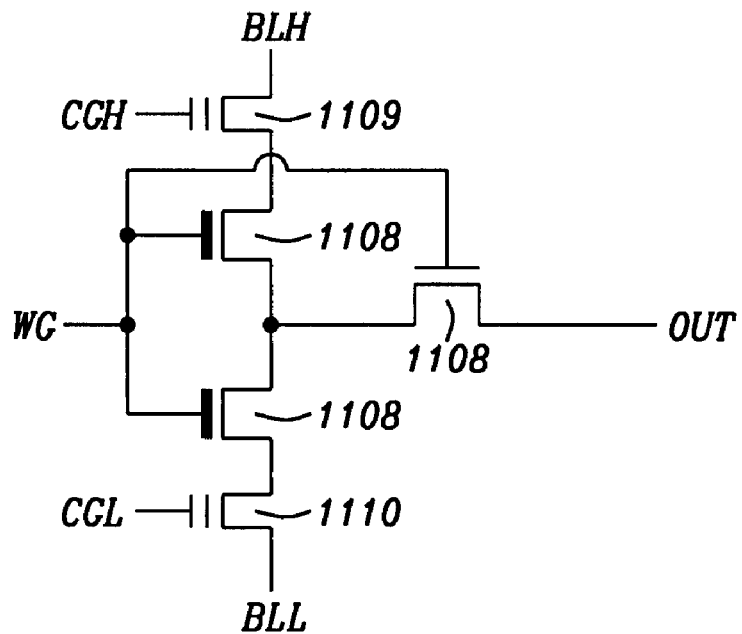
FIG. 7 is an equivalent circuit of the preferred embodiment of the present invention.

The diagram of FIG. 7 provides an equivalent circuit of the storage device M5 of the preferred embodiment. The word gate device 1108 in the equivalent circuit is located in three places, connected to the upper trap charge storage device 1109, connected to the lower trap charge storage device 1110 and connected to OUT where the connection to OUT forms a center-tap of the channel of the storage device M5.

Figure 8:
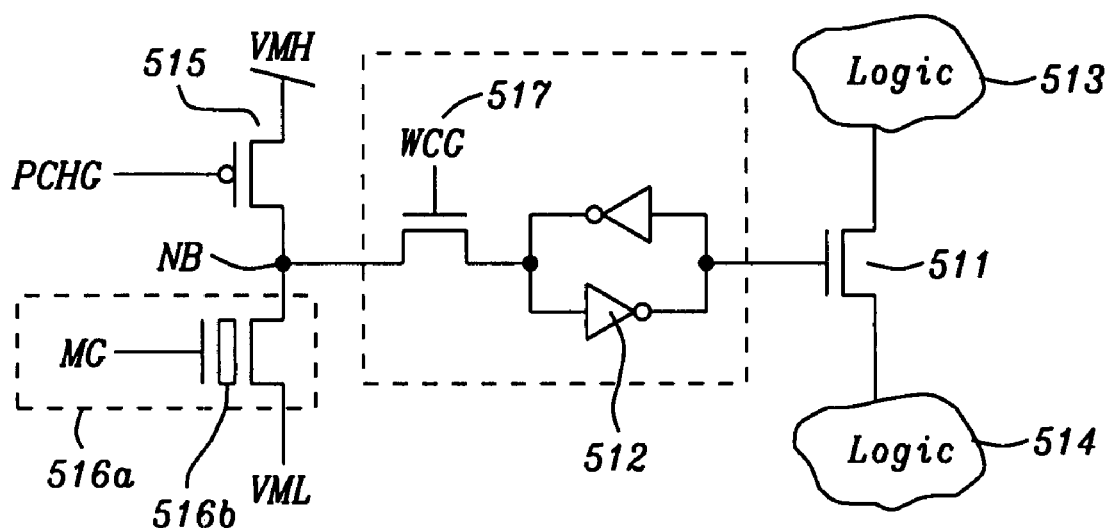
FIG. 8 is a schematic diagram of a second embodiment of the present invention.

In FIG. 8 is shown the second embodiment of the present invention. A P-channel transistor 515 is connected to a memory gate storage transistor 516a between a high voltage VMH and a low voltage VML. The storage transistor 516a is nonvolatile trap charge device where the trap charge element 516b is formed by an insulator, for example a nitride film or a nano-crystal film. The connection between the P-channel transistor 515 and the storage transistor 516a forms a node NB, which is connected to a latch 512 through a write control gate 517. The state of the latch 512 controls the on-off state of the logic interconnect transistor, which couples two logic functions 513 and 514 together when the logic interconnect transistor is turned on.

Figure 9:
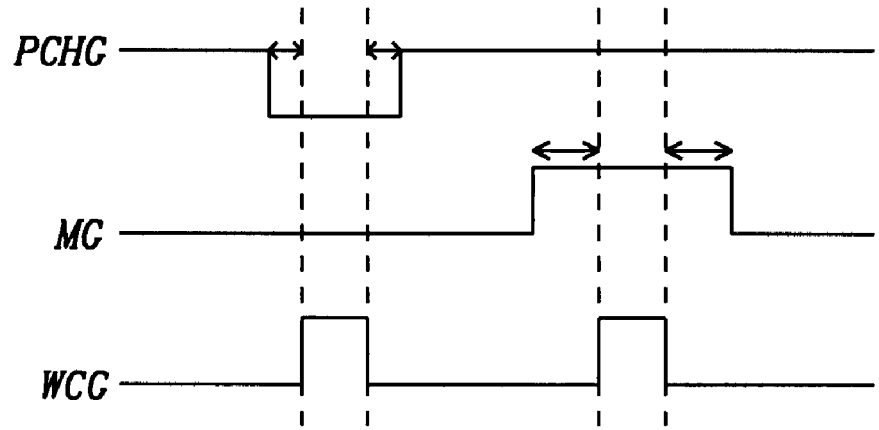
FIG. 9 is a timing diagram of the second embodiment of the present invention.

Continuing to refer to FIG. 8, the write control gate 517 is opened twice in the process of setting the latch 512, first to reset the latch to a high state and second to program the state of the latch. The latch is reset to a high logic state using the precharge transistor 515 where the node NB is charged to a high value. With the precharge transistor 515 and the word control gate 517 off, the storage transistor 516a is turned on. If the storage transistor is programmed to a low state (no trapped charge) the node NB will fall to a value equal to VML. When the word control gate is turned on for the second time, the state of the latch 512 is switched to a low state. If the storage transistor is programmed to a high state (trapped charge), the node NB remains in the high voltage state, and when the write control gate is turned on a second time, the latch remains in the high state. FIG. 9 shows the timing of the PCHG signal connected to the precharge transistor 515, the WCG signal connected to the word gate transistor 517 and the MG signal connected to the storage transistor 516a.

Figure 10:
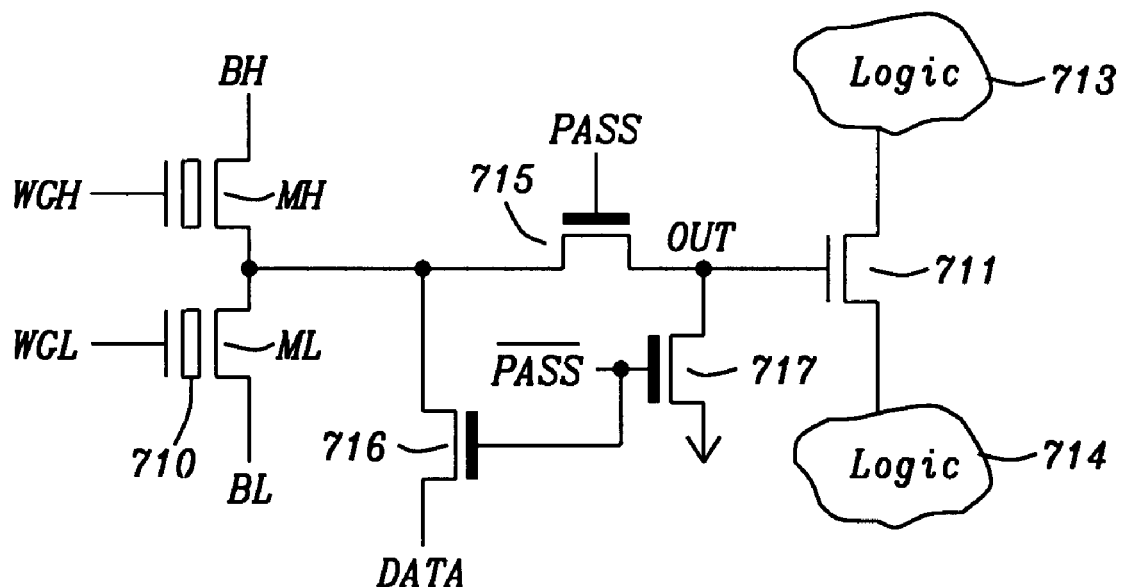
FIG. 10 is a schematic diagram of the third and fourth embodiment of the present invention.

In FIG. 10 is the schematic diagram of the third and fourth embodiments of the present invention. Two NMOS storage transistors MH and ML are connected in series between a high bias BH and a low bias BL. The storage transistors MH and ML are nonvolatile and are formed with a charge storing insulator film 710 under the gate of each storage transistor. The charge storing insulator 710, which lays between the oxide formed over the semiconductor substrate and the gate of each storage transistor, is an insulator which is capable of storing a charge, for example a nitride film or a nano crystal film. Electrons are injected or ejected from the charge storing insulator 710 using Fowler-Nordeim tunneling or direct tunneling. The two storage transistors are allow two programmed states, where (1) the upper storage transistor MH is programmed to block the bias voltage BH and the lower storage transistor ML is erased to allow the low bias BL to be connected to the pass transistor 715; and (2) the lower storage transistor ML is programmed to block the bias voltage BL and the upper storage transistor MH is erased to allow the high bias BH to be connected to the pass transistor 715.

Continuing to refer to FIG. 10, the storage transistors MH and ML are decoupled from the logic interconnect transistor 711 during programming and erase operations by the pass transistor 715, the grounding transistor 717 and the data transistor 716. When the gate of the pass transistor 715 is high, the storage transistors MH and ML control the logic interconnect transistor. When the gate of the pass transistor is low, the gate of the logic interconnect transistor is grounded by the grounding transistor 717 to turn off the logic interconnect transistor 711 and protect the logic interconnect transistor from the high voltages of the erase and program operations of the two storage transistors MH and ML. The storage transistors MH and ML are programmed and erased in the third embodiment of the present invention by tunneling electrons to and from the respective channel. TABLE 3 provides a tabulation of the approximate voltages required to program and erase the storage transistors MH and ML as well as read the state of the storage transistors connected to OUT through the pass transistor 715 to operate the logic interconnect transistor 711. The switch state of the logic interconnect transistor is "off" when the upper storage transistor MH is programmed and the lower storage transistor is erased to allow the low bias voltage BL to be connected to OUT thorough the pass transistor 715. The switch state of the logic interconnect transistor 711 is "on" when the lower storage transistor ML is programmed and the upper storage transistor MH is erased, which allows the high bias voltage BH to be connected through the pass transistor 715 to be connected to OUT through the pass transistor 715. The voltages shown under "PASS" in TABLE 3 are the required PASS BAR voltages connected to the gates of the data transistor 716 and the grounding transistor 717. The higher voltage of (15) is required to allow the data transistor 716 to couple 15 V from DATA to the storage transistors MH and ML during the high voltage erase operation.

the PASS column in parenthesis are for the PASS BAR voltages needed to allow the higher DATA voltages to be connected to the storage transistors MH and ML.

Figure 11:
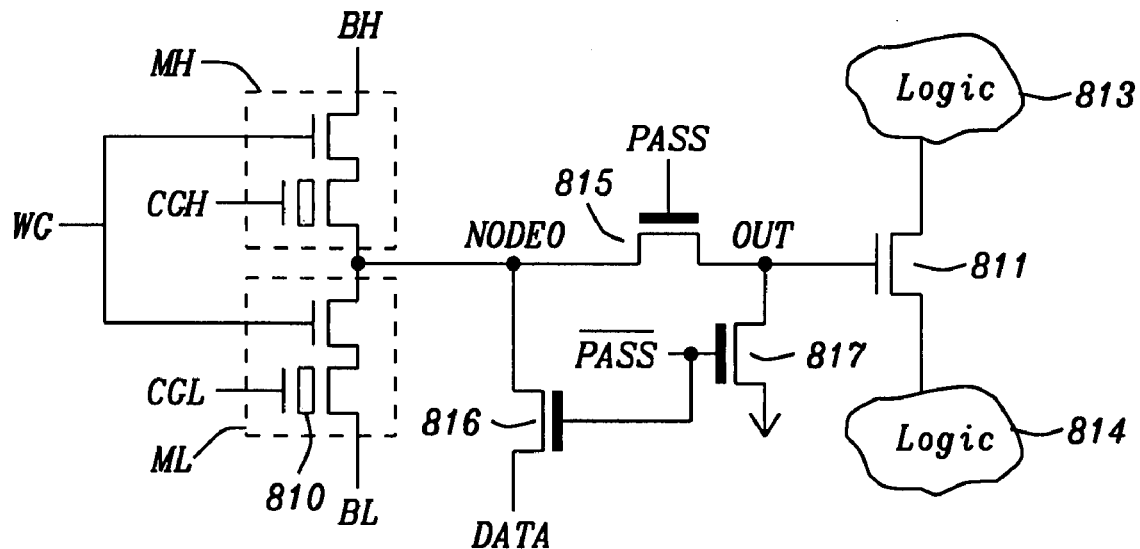
FIG. 11 is a schematic diagram of the fifth embodiment of the present invention.

In FIG. 11 is shown a circuit diagram of the fifth embodiment of the present invention. There are two storage devices MH and ML, which are single sided split gate devices using an insulator 810 to trap charge. A nitride film or a nano crystal film forms the charge storage insulator, which is located under the control gate of the storage element. Node0, formed at the connection between the two storage devices, is connected through a pass gate 815 to OUT which is connected to the gate of the logic interconnect transistor, which connects between two logic functions 813 and 814. The data gate 816 and the grounding gate 817 are controlled by a PASS BAR signal which allows program and erase data to be connected to Node0 and the gate of the logic interconnect transistor to be grounded.

The two storage devices MH and ML are connected in series between a high bias BH and a low bias BL. The word gates of the split gate storage devices are connected together and controlled by a word gate signal WG. The control gate of the split gate storage element of the upper storage element MH is controlled by a control gate signal CGH, and the split gate control gate of the lower storage element ML is controlled by a control gate signal CGL. TABLE 5 provides the

TABLE 3

| Mode | WGH | WGL | BH | BL | DATA | PASS | OUT | Switch State |
|---|---|---|---|---|---|---|---|---|
| Read | 1.5~2 | 1.5~2 | 1.5 | 0 | X | 2.5 | 0 | OFF |
| Read | 1.5~2 | 1.5~2 | 1.5 | 0 | X | 2.5 | 1.5 | ON |
| Program ML | 0 | 15 | 0 | 0 | 0 | 0 | 0 | OFF |
| Program MH | 15 | 0 | 0 | 0 | 0 | 0 (2.5) | 0 | OFF |
| Erase ML & MH | 0 | 0 | 15 | 15 | 15 | 0 (15) | 0 | OFF |
| Erase ML | 0~2+ | 0 | 0 | 15 | 15 | 0 (15) | 0 | OFF |
| Erase MH | 0~2+ | 0 | 15 | 0 | 15 | 0 (15) | 0 | OFF |

TABLE 4

| Mode | WGH = WGL | BH | BL | DATA | PASS | OUT | Switch State |
|---|---|---|---|---|---|---|---|
| Read | 1.5~2 | 1.5 | 0 | X | 2.5 | 0 | OFF |
| Read | 1.5~2 | 1.5 | 0 | X | 2.5 | 1.5 | ON |
| Program ML | 8 | 0 | 10 | 0 | 0 | 0 | OFF |
| Program MH | 8 | 0 | 10 | 10 | 0 (11) | 0 | OFF |
| Erase ML | −5 | | 7 | | 0 | 0 | OFF |
| Erase MH | −5 | | | 7 | 0 (8) | | OFF |
| Erase Unselected MH | −5 | 7 | 0 | 0 or 7 | 0 (2.5) | 0 | OFF |

In the fourth embodiment of the present invention, the storage transistors MH and ML (circuit shown in FIG. 10) are programmed by channel hot electron tunneling and erased by hot hole injection, where the approximate voltages are shown in TABLE 4. As can be seen comparing tables 3 and 4 the program and erase voltages are different and the voltages in approximate voltages required to program and erase the storage devices MH and ML and as well as read the state of the storage devices coupled to OUT through the pass transistor 815 to operate the logic interconnect transistor 811 which connects between two logic functions 813 and 814. The numbers in the PASS column in parentheses are approximate values for PASS BAR with the "x" indicates that other values can be used. Programming is done with hot electron tunneling and erase is performed with hot hole injection into the stored charge insulator. The switch state is "off" when the upper storage device MH is programmed and the lower storage device ML is erased, which allows the low bias voltage BL to be connected to Node0 and through the pass transistor 815 to OUT and the gate of the logic interconnect transistor 811. The switch state is "on" when the lower storage device ML is programmed and the upper storage device MH is erased, which allows the high bias voltage BH to be connected to Node0 and through the pass transistor 815 to OUT and the gate of the logic interconnect transistor 811.

TABLE 5

| Mode | WG | CGH | CGL | BH | BL | DATA | PASS | NODE0 | OUT | Switch State |
|---|---|---|---|---|---|---|---|---|---|---|
| Read | 2.5 | 2.5 | 1.5 to 2.5 | 2.0 | 0 | x | 2.5 | 0 | 0 | OFF |
| Read | 2.5 | 2.5 | 1.5 to 2.5 | 2.0 | 0 | x | 2.5 | 2.0 | 2.0 | ON |

TABLE 5-continued

| Mode | WG | CGH | CGL | BH | BL | DATA | PASS | NODE0 | OUT | Switch State |
|---|---|---|---|---|---|---|---|---|---|---|
| Erase ML & MH | 0 to −2 | −3 | −3 | 0 | 4 | 4 | 0(7x) | 4 | 0 | OFF |
| Program ML | 1.0 | 0 | 5 | 0 | 5 | 0 | 0/7x) | 0 | 0 | OFF |
| Program MH | 1.0 | 5 | 0 | 0 | 0 | 5 | 0(7) | 5 | 0 | OFF |
| Erase ML | 0 to −2 | 0x | −3 | 0 | 4 | 0x | 0(7x) | 0x | 0 | OFF |
| Erase MH | 0 to −2 | −3 | 0x | 0 | 0x | 4 | 0/(7) | 4 | 0 | OFF |

Figure 12:
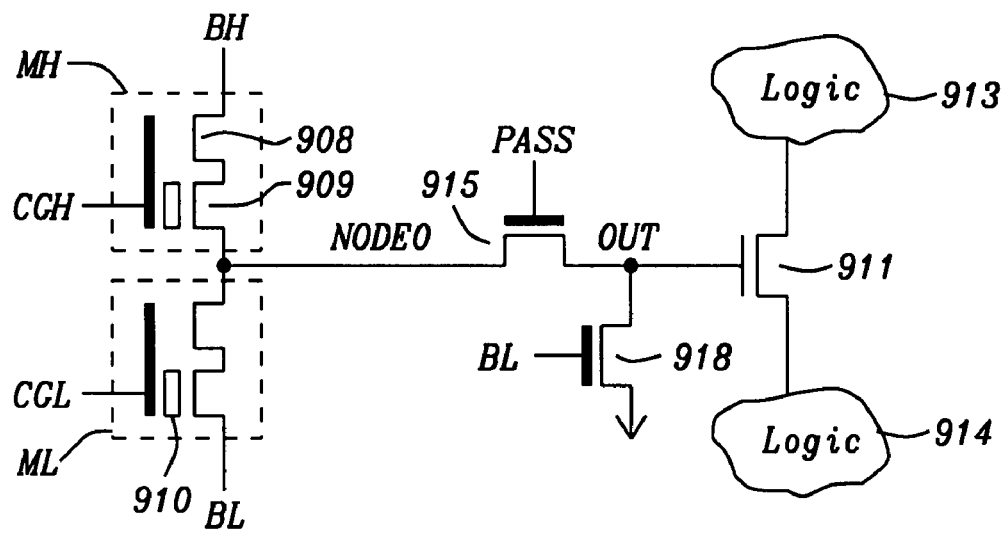
FIG. 12 is a schematic diagram of the sixth embodiment of the present invention.

FIG. 12 shows the circuit diagram of the sixth embodiment of the present invention. An upper split gate storage device MH is connected to a lower split gate storage device ML between two bias voltages BH and BL. Each split gate storage device MH and ML are formed by a word gate portion 908 and a split gate portion 909. A storage site comprising a charge trapping insulator 910 is located under the gate of the split gate portion 909. The charge trapping comprises a nitride film or a nano crystal film. The control gate and the word gate of each storage devices MH and ML are common and connected to a control gate high CGH signal and a control gate low CGL signal, respectively. The connection between the upper and lower split gate storage device forms Node0, which is connected to OUT and the gate of the logic interconnect transistor 911 through the pass transistor 915. The logic interconnect transistor 911 couples between two logic functions 913 and 914. The gate of the grounding transistor 918 is connected to the low bias voltage BL, which turns on the grounding transistor 918 during program and erase operations.

Figure 13:
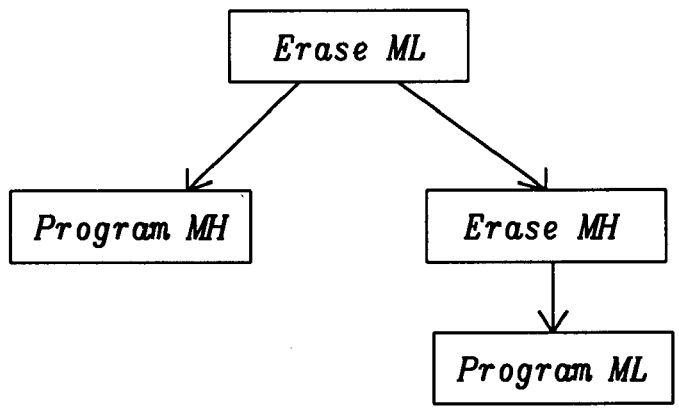
FIG. 13 is a state diagram for programming and erase of the sixth embodiment of the present invention.

Since the control gate and the word gate are common in the storage devices MH and ML of the sixth embodiment of the present invention a special sequence of erase and program operations are necessary. FIG. 13 provides a state diagram of the program and erase order for the storage devices in FIG. 12. Either ML or MH can be in the program state. The other storage site must be in the erase state. If the low storage device ML is programmed and if the high storage device MH is to be programmed, then the low storage device ML is first erased before the storage high device MH is programmed. If the storage low device ML is to be programmed, then the storage high device MH is erased before storage low ML is programmed.

Figure 14:
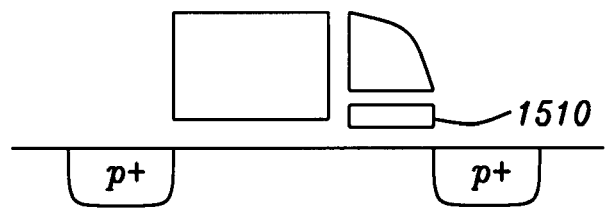
FIG. 14 is a cross section of a PMOS device used in the seventh embodiment of the present invention.
Figure 15:
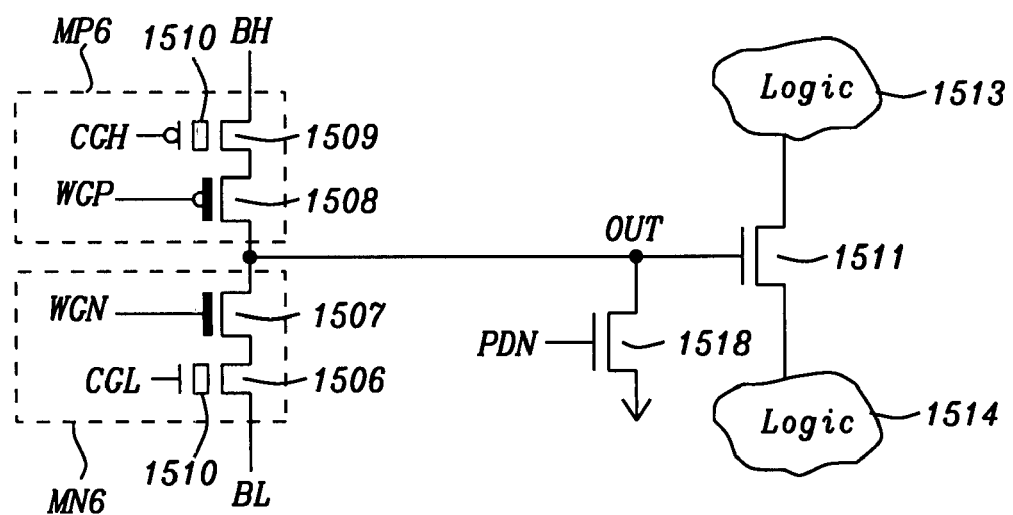
FIG. 15 is a schematic diagram of the seventh embodiment of the present invention.

TABLE 6 provides the approximate voltages needed to program, erase and read the storage devices of the sixth embodiment of the present invention. The state of the switch 911 is "off" when the upper storage device MH is programmed and the lower storage device ML is erased. Conversely, the state of the switch is "on" when the upper storage device MH is erased and the lower storage device ML is programmed. The insulator storage elements are programmed by hot electron tunneling and erased using hot hole injection In embodiment 7 of the present invention a P-channel split gate storage device with an insulator film 1510 for storing charge is shown in the cross section of FIG. 14. This P-channel split gate storage device MP6 is connected to the high bias BH in FIG. 15. An N-channel split gate storage device MN6 is connected to MP6 forming OUT, which is connected to the gate of the logic interconnect transistor 1511. The logic interconnect transistor couples logic functions 1513 and 1514. A grounding transistor 1518 is connect between OUT and ground to connect OUT to ground during program and erase operations under the control of the signal PDN. The N-channel split gate storage device MN6 comprises a word gate portion 1507 connected to a word gate signal WGN and a control gate portion 1506 containing a charge storing insulator film 1510 is connected to a control gate signal CGL. The control gate portion 1506 is further connected to a low bias BL. The P-channel split gate storage device comprises a control gate portion 1509 and a word gate portion 1508. The P-channel control gate portion 1509 contains a charge storing insulator film 1510, and is connected to a control gate signal CGH. The P-channel word gate portion 1508 is connected to a word gate signal WGP and to the word gate portion 1507 of the N-channel split gate device MN6.

Programming charge onto the insulator 1510 of the P-channel split gate device MP6 raises the threshold voltage of the control gate portion 1509 of the P-channel split gate device MP6, which blocks BH from OUT. Erasing charge from the insulator 1510 of the N-channel split gate device MN6 lowers the threshold voltage of the control gate portion 1506 of the N-channel split gate device MN6 allowing BN to be connected to OUT and controlling the logic interconnect transistor 1511 "off". Programming charge onto the insulator 1510 of the N-channel split gate device MN6 raises the threshold voltage of the control gate portion 1506 of the N-channel split gate device MN6, which blocks BL from OUT. Erasing charge from the insulator 1510 of the P-channel split gate device MP6 lowers the threshold voltage of the control gate portion 1509 of the N-channel split gate device MP6 allowing BH to be connected to OUT and controlling the logic interconnect transistor 1511 "on".

While the invention has been particularly shown and described with reference to preferred embodiments thereof, it will be understood by those skilled in the art that various

TABLE 6

| Mode | CGH | CGL | BH | BL | PASS | NODE0 | OUT | Switch State |
|---|---|---|---|---|---|---|---|---|
| Read | 2.5 | 1.5-2.5 | 1.5-2.0 | 0 | 2.5 | 0 | 0 | OFF |
| Read | 2.5 | 1.5-2.5 | 1.5-2.0 | 0 | 2.5 | 1.5 | 1.5 | ON |
| Erase ML | 0x | −3 | 0x | 5 | Float 0x | 0 | 0 | OFF |
| Program MH | 5 | 6 | 0 | 5 | 0 | 0 | 0 | OFF |
| Erase MH | −3 | 6 | 0 | 5 | 0 | 5 | 0 | OFF |
| Program 1 ML | 0 | 5 | 0 | 5 | 0 | 5 | 0 | OFF | changes in form and details may be made without departing from the spirit and scope of the invention.

What is claimed is:

1. A non-volatile interconnect circuit, comprising:
   a) a nonvolatile storage device coupled to a logic interconnect transistor;
   b) said nonvolatile storage device formed from a trap charge storage element, wherein a channel of the nonvolatile storage device coupled to said logic interconnect transistor;
   c) said logic interconnect device selected by charge stored in an insulator in said nonvolatile storage device; and
   d) said trap charge programmed electronically to select said logic interconnect transistor.

2. The interconnect circuit of claim 1, wherein said trap charge storage element is formed using an insulator film that provides nonvolatile charge storage, comprising one of;
   a) a nitride film; and
   b) a nano crystal film.

3. A nonvolatile interconnect circuit, comprising:
   a) a nonvolatile storage device coupled to a logic interconnect transistor;
   b) said nonvolatile storage device formed from a trap charge storage element;
   c) said logic interconnect device selected by charge stored in an insulator in said nonvolatile storage device;
   d) said trap charge programmed electronically to select said logic interconnect transistor;
   e) a word gate portion centered between two storage portions, wherein each said two storage portions formed by said insulator under a control gate to trap charge and control the state of said logic interconnect transistor, which couples two logic elements together;
   f) a gate of said logic interconnect transistor coupled to a channel portion under said word gate; and
   g) a value of said trap charge determines whether a high voltage or a low voltage is coupled to the gate of the logic interconnect transistor from said channel portion.

4. A nonvolatile interconnect circuit, comprising:
   a) a nonvolatile storage device coupled to a logic interconnect transistor;
   b) said nonvolatile storage device formed from a trap charge storage element;
   c) said logic interconnect device selected by charge stored in an insulator in said nonvolatile storage device;
   d) said trap charge programmed electronically to select said logic interconnect transistor;
   e) said nonvolatile storage device is a single nonvolatile storage transistor connected in series with a P-channel transistor between a high voltage and a low voltage whereby the connection between the single nonvolatile storage transistor and the P-channel transistor couples a logic state through a write control gate to a latch from which a logic state of said logic interconnect device is determined and whereby said P-channel transistor resets the latch.

* * * * *